(12) United States Patent
Eminoglu et al.

(10) Patent No.: US 8,097,904 B2
(45) Date of Patent: Jan. 17, 2012

(54) METHOD AND APPARATUS FOR BACKSIDE ILLUMINATED IMAGE SENSORS USING CAPACITIVELY COUPLED READOUT INTEGRATED CIRCUITS

(75) Inventors: Selim Eminoglu, Ankara (TR); Stefan C. Lauxtermann, Camarillo, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 0 days.

(21) Appl. No.: 12/877,037

(22) Filed: Sep. 7, 2010

(65) Prior Publication Data

US 2011/0215222 A1 Sep. 8, 2011

Related U.S. Application Data

(63) Continuation of application No. 12/330,891, filed on Dec. 9, 2008, now Pat. No. 7,795,650.

(51) Int. Cl.
*H01L 27/148* (2006.01)
*H01L 21/00* (2006.01)

(52) U.S. Cl. .......................................... 257/228; 438/48
(58) Field of Classification Search ..................... 438/48, 438/54, 78–79; 257/225–234
See application file for complete search history.

(56) References Cited

U.S. PATENT DOCUMENTS

| | | | |
|---|---|---|---|
| 4,956,716 A | 9/1990 | Hewitt et al. | |
| 5,303,027 A | 4/1994 | Kuderer et al. | |
| 5,471,515 A | 11/1995 | Fossum et al. | |
| 5,847,594 A | 12/1998 | Mizuno | |
| 6,011,251 A | 1/2000 | Dierickx et al. | |
| 6,121,843 A | 9/2000 | Vampola et al. | |
| 6,157,170 A | 12/2000 | Noda et al. | |
| 6,239,456 B1 | 5/2001 | Berezin et al. | |
| 6,300,613 B1 | 10/2001 | Kuderer | |
| 6,326,603 B1 | 12/2001 | Kuderer | |
| 6,455,837 B2 | 9/2002 | Mizuno | |
| 6,486,504 B1 | 11/2002 | Guidash | |
| 6,603,109 B2 | 8/2003 | Pantigny et al. | |
| 6,642,496 B1 | 11/2003 | Gulbransen | |
| 6,642,503 B2 | 11/2003 | Kummaraguntla et al. | |
| 6,664,777 B2 | 12/2003 | Hyakutake et al. | |
| 6,678,039 B2 | 1/2004 | Charbon | |
| 6,713,796 B1 | 3/2004 | Fox | |

(Continued)

OTHER PUBLICATIONS

O. Yadid-Pecht, "Wide Dynamic Range Sensors," IEEE Transactions on Electron Devices, vol. 44, No. 10, pp. 1721-1723, Oct. 1997.*

(Continued)

*Primary Examiner* — Calvin Lee
(74) *Attorney, Agent, or Firm* — Snell & Wilmer LLP

(57) ABSTRACT

The images sensor includes a readout circuit capacitatively coupled to a memory circuit. The readout circuit includes: (i) a photon detector to receive a plurality of photons and to provide a charge signal corresponding to the received photons, (ii) a resettable integrator that is reset multiple times over a single exposure time and provides an analog representation of the incident photons during the last integration cycle, and (iii) a comparator that monitors the integrator output and generates a reset pulse when the integrator reaches a built-in threshold value. The memory circuit includes: (i) a receiver circuit that detects the output of the digital driver in the front-end readout circuit via capacitive coupling and generates a digital voltage pulse for each received signal, and (ii) a digital counting memory to count the received pulses to provide a coarse digital representation of how many times the integrator is reset.

9 Claims, 4 Drawing Sheets

U.S. PATENT DOCUMENTS

| | | | |
|---|---|---|---|
| 6,885,047 B2 | 4/2005 | Shinohara et al. | |
| 6,919,549 B2 | 7/2005 | Bamji et al. | |
| 6,977,601 B1 | 12/2005 | Fletcher et al. | |
| 6,977,682 B2 | 12/2005 | Mizuno et al. | |
| 7,115,925 B2 | 10/2006 | Rhodes | |
| 7,138,287 B2 | 11/2006 | Mouli et al. | |
| 7,157,685 B2 | 1/2007 | Bamji et al. | |
| 7,202,463 B1 | 4/2007 | Cox | |
| 7,244,919 B2 | 7/2007 | Ishikawa et al. | |
| 7,326,903 B2 | 2/2008 | Ackland et al. | |
| 7,388,413 B1 | 6/2008 | Ball | |
| 7,453,131 B2 | 11/2008 | Marshall et al. | |
| 7,538,307 B1 | 5/2009 | Lauxtermann | |
| 7,741,609 B2 | 6/2010 | Mott | |
| 7,795,650 B2 * | 9/2010 | Eminoglu et al. | 257/228 |
| 2003/0213984 A1 | 11/2003 | Berezin et al. | |
| 2005/0092894 A1 | 5/2005 | Fossum | |
| 2005/0167709 A1 | 8/2005 | Augusto | |
| 2006/0181627 A1 | 8/2006 | Farrier | |
| 2007/0194356 A1 | 8/2007 | Moon et al. | |

OTHER PUBLICATIONS

"CMOS Minimal array", Janesick et al., *Proceedings of the SPIE.* vol. 6295. (2006): 62950O, 15 pages.

"Fabrication and Initial Results for a Back-Illuminated Monolithic APS in a Mixed SOI/bulk CMOS Technology", Bedabrata pain, As presented at the Jun. 2005 *IEEE Workshop on Charge-Coupled Devices and Advanced Image Sensors*, pp. 102-104.

"Design of High-Performance Microprocessor Circuits", Chandrakasan et al., *IEEE Press*, pp. 285-308, 2001.

"Back-Gate Controlled READ SRAM with Improved Stability", Jae-Joon Kim, et al., *IEEE International SOI Conference*, pp. 211-212, 2005.

"An SOI 4 Transistors Self-Refresh Ultra-Low-Voltage Memory Cell", Oliver Thomas, *ISCAS*, pp. V-401-V-404, May 2003.

"3-D ICs: A Novel Chip Design for Improving Deep-Submicrometer Interconnect Performance and Systems-on-Chip Integration," Banerjee et al., *Proceedings of the IEEE*, vol. 89, N. 5, pp. 602-633, May 2001.

"A 0.18μm CMOS 1000 frames/sec, 138dB Dynamic Range Readout Circuit for 3D-IC Focal Plane Arrays", Kavusi et al., Department of Electrical Engineering, Stanford University, 4 pages, 2003.

"Chip-to-Chip Interconnections Based on the Wireless Capacitive Coupling for 3D Integration", Charlet et al., *Microelectronic Engineering 83*, pp. 2195-2199, 2006.

"CMOS Image Sensors", Gamal et al., *IEEE Circuits & Devices Magazine*, pp. 6-20, May/Jun. 2005.

"CMOS Image Sensors: Electronic Camera-On-A-Chip", Eric R. Fossum, *IEEE Transactions on Electron Devices*, vol. 44, No. 10, pp. 1689-1698, Oct. 1997.

"A Computational Image Sensor with Adaptive Pixel-Based Integration Time", Hamamoto et al., *IEEE Journal of Solid-State Circuits*, vol. 36, No. 4, pp. 580-585, Apr. 2001.

"Demystifying 3D ICs: The Pros and Cons of Going Vertical", Davis Rhett W. et al., IEEE Design & Test of Computers; pp. 498-510; 2005.

"Development of a Production-Ready, Black-Illuminated CMOS Image Sensor with Small Pixels", Joy et al., IEEE, pp. 1007-1010, 2007.

"Folded Multiple-Capture: An Architecture for High Dynamic Range Disturbance-Tolerant Focal Plane Array", Kavusi et al., *Proc. of SPIE*, vol. 5406, pp. 351-360, 2004.

"High Density Vertical Interconnects for 3-D Integration of Silicon Integrated Circuits", Bower et al., *2006 Electronic Components and Technology Conference*, pp. 399-403, 2006.

"In-Pixel Autoexposure CMOS APS," Yadid-Pecht et al., *IEEE Journal of Solid-State Circuits*, vol. 38, No. 8, pp. 1425-1428, Aug. 2003.

"Intelligent Image Sensor Chip with Three Dimensional Structure", Kurino et al., *IEDM*, pp. 879-882, 1999.

"Scientific CMOS Pixels", Janesick et al., *Scientific CMOS Pixels*, pp. 103-114, 2001.

"Synthesis of high Dynamic Range Motion Blur Free Image From Multiple Captures", *IEEE Transactions on Circuits and Systems-I: Fundamental Theory and Applications*, vol. 50, No. 4, pp. 530-539, Apr. 2003.

"Vertically-Integrated Sensor Arrays—VISA", Horn et al., *Proc. of SPIE*, vol. 5406, pp. 332-340, 2004.

"A Wafer-Scale 3-D Circuit Integration Technology", Burns et al., *IEEE Transactions on Electron Devices*, vol. 53, No. 10, pp. 2507-2516, Oct. 2006.

"Wide-Dynamic-Range Sensors", Yadid-Pecht et al., *Optical Engineering*, vol. 38, No. 10, pp. 1650-1660, Oct. 1999.

"Wide Intrascene Dynamic Range CMOS APS Using Dual Sampling", Yadid-Pecht, *IEEE Transactions on Electron Devices*, vol. 44, No. 10, pp. 1721-1723, Oct. 1997.

"PVT—Aware Leakage Reduction for On-Die Caches with Improved Read Stability", Kim et al., 2005 IEEE International Solid State Circuits Conference, pp. 13-15, Feb. 9, 2005.

"Neuromorphic Vision Chip Fabricated Using Three-Dimensional Integration Technology", Koyanagi et al., *IEEE International Solid-State Circuits Conference*, 3 pages, Feb. 7, 2001.

"Proximity Communication", Drost et al., *IEEE Journal of Solid-State Circuits*, vol. 39, No. 9, pp. 1529-1535, Sep. 2004.

"Quantitative Study of High Dynamic Range Image Sensor Architectures", Kavusi, et al., *SPIE-IS&T*, vol. 5301, pp. 264-275, 2004.

* cited by examiner

METHOD AND APPARATUS FOR BACKSIDE ILLUMINATED IMAGE SENSORS USING CAPACITIVELY COUPLED READOUT INTEGRATED CIRCUITS

CLAIM OF PRIORITY UNDER 35 U.S.C. §120

This application is a continuation of and claims the benefit and priority of U.S. application Ser. No. 12/330,891, now U.S. Pat. No. 7,795,650, entitled "METHOD AND APPARATUS FOR BACKSIDE ILLUMINATED IMAGE SENSORS USING CAPACITIVELY COUPLED READOUT INTEGRATED CIRCUITS," filed Dec. 9, 2008, which is assigned to the assignee hereof and hereby expressly incorporated by reference herein.

BACKGROUND

1. Field

The disclosure relates to semiconductor based image sensors and more particularly to backside illuminated Active Pixel image Sensors (APS) with advanced pixel level signal processing capabilities using capacitively coupled readout integrated circuits (ROICs).

2. Related Art

Conventional APS are defined by solid state imaging devices having an array of pixels arranged in columns and rows. Each pixel contains both a photo sensing means and at least one other active component which create a charge that is converted to a voltage or a current signal. The converted signal indicates the amount of light incident upon a pixel. Conventional image sensors were limited to silicon charge coupled devices (CCDs). Over the years, CCDs have become the standard for visible image sensors. The fabrication process for silicon CCDs has always been expensive and complex. As a result, considerable attention has been paid to developing complementary metal-oxide (CMOS) technology as a replacement for the silicon CCDs. As of late, CMOS technology has become the technology of choice, utilized by most foundries for making image sensors, due to its capability of integrating advanced signal processing capabilities with image sensors monolithically on the same die, thus reducing the overall imaging system cost and simplifying system design.

Conventional CMOS technology advantageously places the Readout Integrated Circuit (ROIC) at or near the pixel. Conventional CMOS active pixel sensors rely on each pixel having a charge to voltage conversion amplifier to create local voltages representative of the illumination level recorded at the pixel. FIG. 1 shows a circuit schematic of a prior art CMOS APS pixel.

Referring to FIG. 1, detector 100 receives incident rays 110 at photodetector diode 120. Photon energy is absorbed by detector 100 and generated electrons are captured by the depletion capacitance of the reverse biased photodetector diode 120. These photo-generated electrons alter the pre-defined node voltage 125 across the diode capacitance proportional to the absorbed photons by the pixel, and hence alter the recorded intensity level of the scene being imaged. The pre-defined pixel voltage is established by resetting the pixel depletion capacitance to a known reset voltage level 130 through the pixel reset transistor 140 using reset signal 145. Diode voltage is then buffered by a pixel buffer circuitry, in this case a source follower transistor 150, and connected to the monolithic readout circuits outside the imaging area through pixel select transistor 160 controlled by select signal 165 and a common signal bus 170 shared by all the pixels in a given column.

In some applications, a need exists for more signal processing capabilities other than just charge-to-voltage conversion and buffering. One such case is a high dynamic range imaging application, where the goal is to capture both very dim and bright objects in the same scene. For dim objects, a long exposure time is required to collect sufficiently large number of photons. On the contrary, a short exposure time is required for the very bright objects to avoid saturation and blooming in the pixel. One method to achieve high dynamic range is to use dual or multiple exposures, starting with a short exposure time and ending with a long exposure time. All pixel values need to be readout multiple times for all exposures, decreasing the maximum possible frame time. There is also a limit on the maximum exposure time due to the inherent dark current of the pixel. Therefore, a need exists for a more advanced techniques if one requires high dynamic range and reasonably high frame rates.

Another method to increase the dynamic range is to use pixel level circuitry that can achieve increased dynamic range in a single exposure between pixels of a given image frame. This method uses pixel level automatic or adaptive methods or numerical methods to increase the dynamic range independently for all pixels, which requires complicated pixels with increased transistor count. However, increased circuit complexity requires larger pixels to fit all the required analog and digital circuit blocks, reducing pixel count for a given chip size.

The circuitry disclosed in this document uses numerical methods to extend the dynamic range of the pixel independently; hence, it is possible to capture both very dim and bright pixels in a single exposure or frame. The circuitry uses common building elements used in previously reported high dynamic range pixel circuits. These common building blocks are listed as follows: integrator to accumulate generated charge captured by detectors, a sample and hold circuit to hold the integrator value, a reset circuit that resets the integrator when it reaches a built-in threshold value to avoid saturation and signal loss, a comparator that checks whether the integrator has reached the built-in threshold or not, a memory element that stores how many times the integrator is reset, and a high resolution analog-to-digital converter that reads out the sampled analog integrator output. There are four different methods to extend the dynamic range, and these are to use time-to-saturation, multiple-capture, synchronous self-reset with residue readout, and asynchronous self-reset with multiple capture. The method disclosed here is different than these, and can be considered as asynchronous self-reset with residue readout. It is asynchronous because the reset operation is not determined by a clocked comparator, but instead by a continuously operated comparator. It utilizes a residue readout method by digitizing the sampled analog integrator output. The advantage of asynchronous self-reset is that the integrator output varies the same amount between reset operations, hence it is possible to construct the extended dynamic range signal just using the integrator swing and the number of reset operations as well as the last value of the sampled integrator output. Therefore, it is not required to perform multiple sampling operations, and thus no fine pixel level analog-to-digital converter is needed. Residue digitization can be performed outside the pixel area either using on-chip video rate analog-to-digital converters serving large number of pixel columns or relatively low speed column-parallel analog-to-digital converters. Required memory for the reset count operations is implemented at the pixel level.

Wide dynamic range information is generated by combining the count value of the reset operations, which acts as a Most Significant Bit (MSB) digitizer, and a fine residue value, which acts as a Least Significant Bit (LSB) digitizer.

With the help of 3-D circuit integration technology, it is also possible to distribute the pixel level signal processing into different physical layers vertically integrated as shown in FIG. 2. These physical layers 200 are implemented on different chips 210 and 220 connected at pixel level 230 and 240 using routing metals 270, through silicon vias 280, and indium bumps 290. A typical approach would be to perform electro-optical and analog functions in the first layer, which can be fabricated in a CMOS image sensor process with the emphasis on image sensor and analog performance, and digital functions can be integrated in the second layer, which can be fabricated in a fully digital CMOS process with very high device density. If required, additional layers can be added to the vertical stack of the chips 210 and 220.

However, a 3-D or vertical integration method involves a difficult and expensive fabrication process due to low yield of high-density through silicon via and indium bump based chip-to-chip interconnection processes. Therefore, a need exists for a simple and low-cost fabrication process to connect chips at pixel level to be able to distribute complex pixel functions into multiple layers.

Chip-to-chip signal transmission can also be done using a capacitive coupling technique, which does not require any through silicon via or indium bumps; therefore fabrication costs can be lowered considerably. It was first introduced as a method to provide an improved connectivity between chips to achieve low power and high data rates due to reduced parasitic, and implemented at pad level with a pitch of 50 µm without a need for high density connections. This work is focused on to provide a reliable means of alignment between memory and processor chips, and did not consider high interconnect density applications such as 3-D memories or image sensors where each element of a 2-D matrix requires a connection.

Later it has been demonstrated that it is possible to reduce the pitch and area required by the electrodes of the capacitive coupling circuits used for chip-to-chip interconnects. For example, reduced pitch values as small as 8 µm has been reported.

SUMMARY

The present invention is an alternative method to fabricate high dynamic range image sensors with advanced pixel functionality using a capacitive coupling method, which does not require silicon through vias and indium bumps commonly used for multi-chip vertically integrated image sensors. Even though, capacitive coupling has been previously used in many applications including chip-to-chip wireless data links, its use in vertically integrated image sensors is disclosed for the first time in this document. The proposed pixel circuit uses asynchronous self-reset along with residue digitization, which can be implemented in two layers. These layers can be integrated face-to-face where pixel level connectivity is achieved capacitively using electrodes implemented on both chips using available CMOS layers. Since chips are brought together face to face, light should be brought from the backside to the photonic detectors which are integrated on the first layer residing on top of the stack. Therefore, this method is suited for back-side illuminated image sensors. Considering the fact that modern CMOS processes have high metal densities and oxide thickness, it is difficult for photons to reach the sensitive part of the pixels unless light-pipes and micro-lenses are used. However, back-side illumination removes all the obstacles in the light path, therefore it is a preferred fabrication technique, first used for CCD image sensor fabrication and now gaining popularity among CMOS image sensor fabrication.

In one embodiment, the images sensor includes: a readout circuit capacitatively coupled to a memory circuit. The readout circuit electronically communicates with a photon-receiving pixel. The readout circuit includes: (i) a photon detector to receive a plurality of photons and providing a current or charge signal corresponding to the received photons, and (ii) a resettable integrator that is reset multiple times over a single exposure time and provides analog representation of the incident photons during the last integration cycle, (iii) a comparator that monitors the integrator output and generates a reset pulse when the integrator reaches a built-in threshold value, and that drives the top plate of a capacitor with the replica of the reset pulse, and (iv) a sample and hold circuit that holds the integrator value after exposure ends and drives a common bus shared by column of pixels to route the analog pixel value to the column readout circuit integrated on the same chip, when that particular row is selected. The memory circuit includes: (i) a receiver connected to a bottom plate of the capacitor and receives replica of rest pulses from the first ROIC and generates a digital pulse to drive (ii) a counting memory circuit storing how many time the integrator in the pixel of the first ROIC is reset, and (iii) a digital buffer that drives a common digital bus when a particular row of pixels is selected.

In one embodiment, the disclosure relates to an image sensor comprising: a monolithic image sensor front-end readout circuit capacitavely coupled to a back-end memory circuit. The front-end readout circuit electronically communicates with a photon-receiving pixel integrated on the same die. This readout circuit includes: (i) a photon detector for receiving a plurality of photons and providing a current signal corresponding to the received photons, (ii) an integrator for providing a fine intensity estimate for the received photons as a function of the current signal, (iii) a comparator that generates a digital voltage pulse and resets the integrator to a known level whenever the integrator output crosses a pre-determined threshold level, and (iv) a digital driver that drives the top plate of the coupling capacitor using the generated comparator output. The back-end memory circuit includes: (i) a receiver circuit that detects the output of the digital driver in the front-end readout circuit via capacitive coupling and generates a digital voltage pulse for each received signal, and (ii) a digital counting memory to count the received pulses to provide a coarse digital representation of how many times the integrator is reset. This way, the intensity of the detected photons can be estimated from the sum of the final integrator value and product of the digital counting memory value and voltage swing of the integrator.

In another embodiment, a light detection apparatus comprising a photodetector receiving a plurality of incoming photons and providing an output signal corresponding to the luminosity of the incoming photons; a first integrator receiving the output signal and determining a fine representation of the intensity signal defining luminosity of least significant portion of the incoming photons; a controller for resetting the first integrator according to a reset logic; a capacitor charged with the fine intensity signal of the first integrator; a second integrator receiving the first integrator output via coupling capacitor in charge domain to form an amplified replica of this signal with sufficient amplitude to drive a counting memory circuit to count the number of times the controller resets the first integrator, wherein the first integrator and the reset logic reside in one chip and the second integrator and counting memory reside in another chip, and electrical connection between them is established via capacitive coupling formed at the interface of these two chips. The intensity of the detected photons can be estimated from the sum of the final value of the first integrator and product of the digital counting memory value and voltage swing of the first integrator.

In another embodiment, an image sensor implemented in two physical layers each implemented in separate chips. First layer contains array of pixels that contains photodiodes and mostly analog front-end pixel circuits as well as necessary readout circuit modules outside the pixel array to read out the analog pixel value. To overcome the saturation problem of the typical CMOS sensors, integrator is reset multiple times during exposure, and this has been communicated to the second layer to keep track of the count of reset operations. Therefore, first layer only contains the analog integrator value since the last reset operation, and by using the reset count information actual pixel value can be calculated resulting in a very high dynamic range. Second layer contains array of pixels that contains mostly digital back-end pixel circuits as well as necessary readout circuit modules outside the pixel array to read digital pixel value. This allows exposing and reading out all pixels in parallel, which makes very high scanning rates possible. Analog and digital pixel values can be readout from different chips and combined externally to increase the dynamic range of the pixel to the level not possible in single chip solutions.

BRIEF DESCRIPTION OF THE DRAWINGS

The disclosure will be discussed with reference to the following non-limiting and exemplary illustrations in which like elements are numbered similarly, and where.

DETAILED DESCRIPTION

Figure 3:
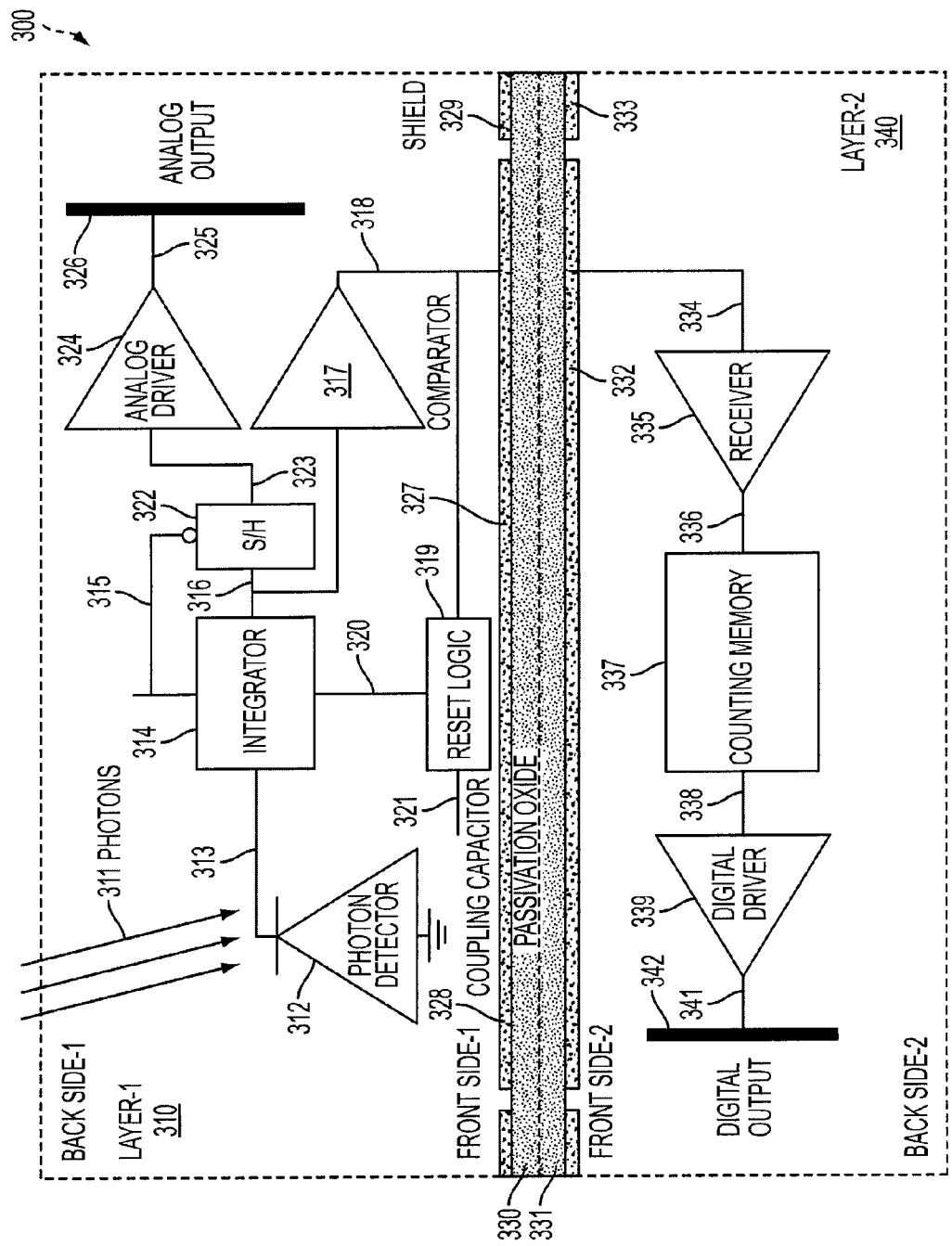
FIG. 3 shows a circuit block diagram according to an embodiment of the present invention.

FIG. 3 shows a circuit block diagram 300 according to an embodiment of the present invention. The functional embodiment of FIG. 3 can be implemented at pixel level in linear or plane array format using two physical layers, layer-1 310 and layer-2 340. In one embodiment, each pixel of an array of pixels independently implements the embodiment of FIG. 3. In FIG. 3, photons 311 are received by photon detector 312. Photon detector 312 can comprise any conventional photosensitive element such as a photodiode.

Figure 1:
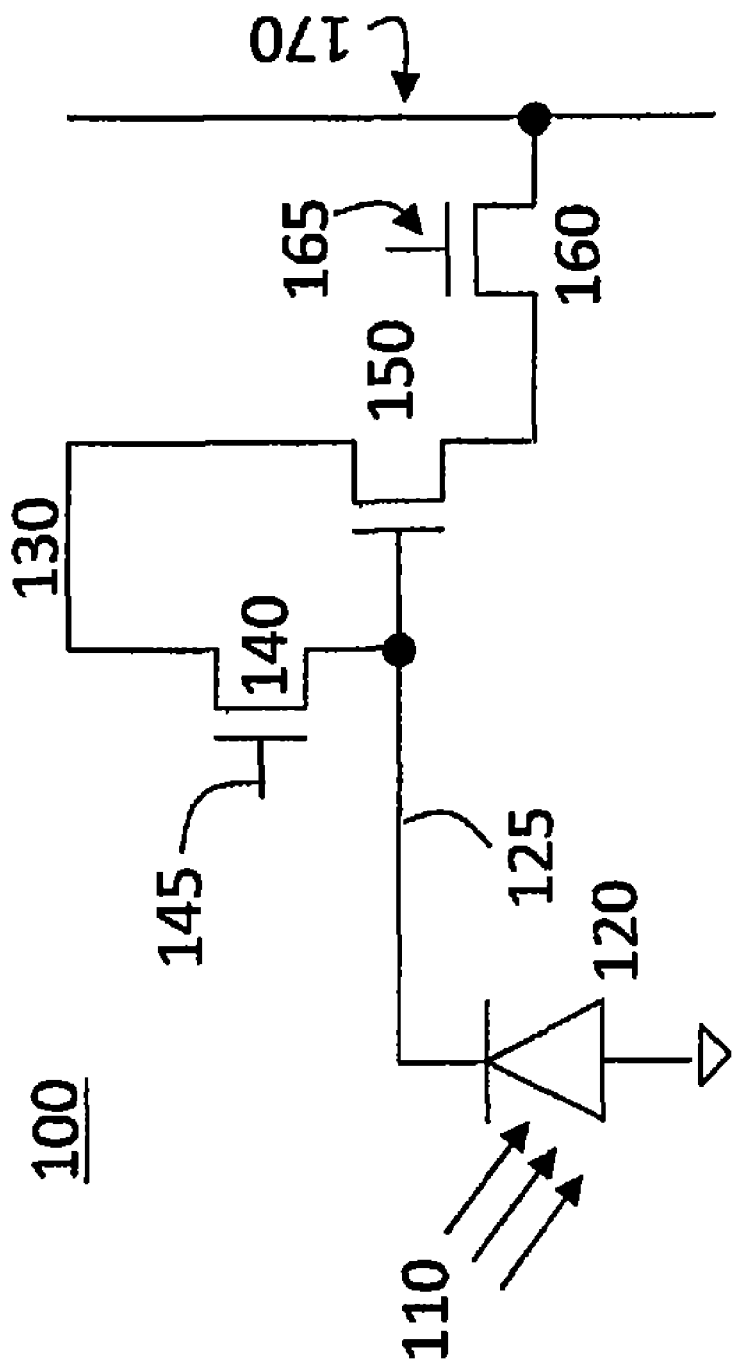
FIG. 1 shows a circuit schematic of a prior art CMOS APS pixel.
Figure 2:
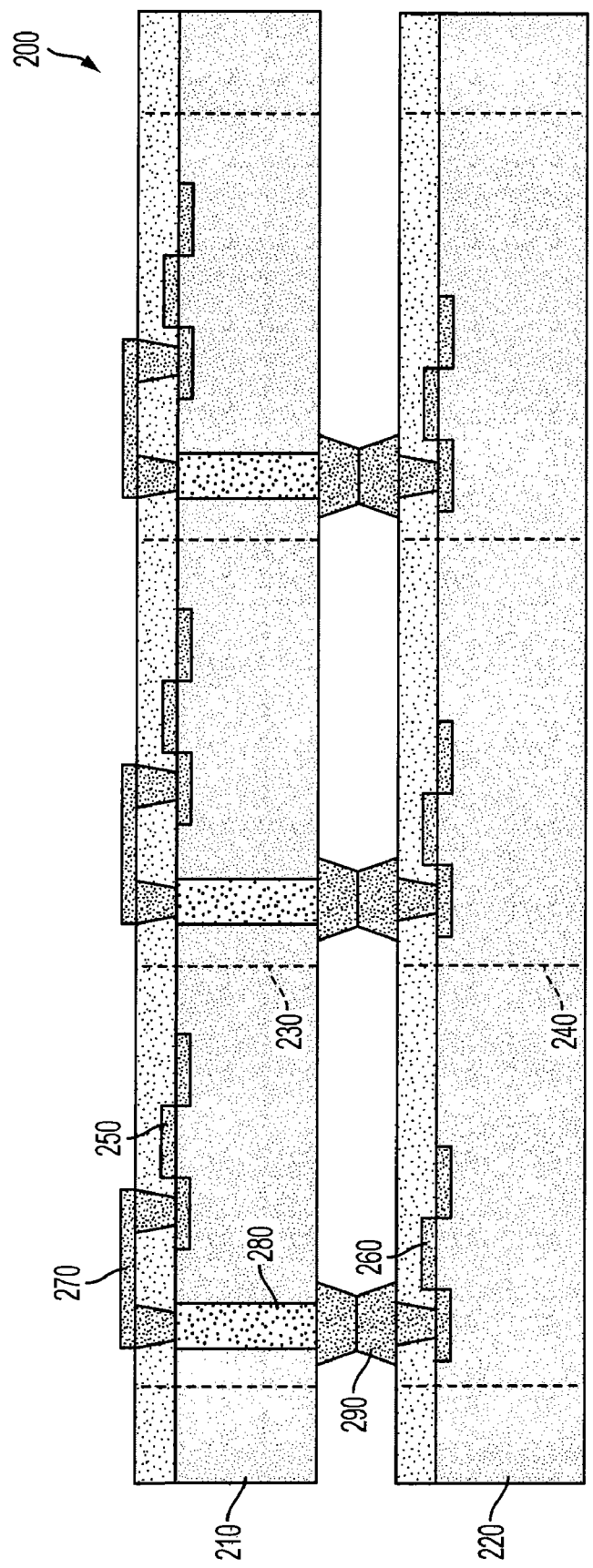
FIG. 2 shows a cross-section of a prior art dual-chip imaging sensor integrated using 3-D fabrication techniques using through silicon via and indium bump technologies.

Photon detector 312 can be readout in different ways using the conventional three transistor (3-T) pixel structure shown in FIG. 1 or using more advanced pixel readout circuits using a capacitive trans-impedance amplifier (CTIA), which is basically an integrator. The CTIA has the advantage of providing constant detector reverse bias potential during exposure. Charge signal 313, generated by photon detector 312, is accumulated by integrator 314. In the case of the 3-T pixel, the photon detector 312 performs the charge integration.

In one embodiment, charge signal 313 is used to generate a voltage pulse. Integrator 314 receives the charge signal 313 and determines a cumulative magnitude of charge signals 313 received from photon detector 312 during a given exposure or integration time.

Integrator output 316 is fed to a comparator 317, which monitors whether integrator output 316 has reached a predetermined threshold voltage level or not. When integrator output 316 reaches the threshold voltage level, reset logic 319 provides the required reset signals 320 to the integrator 314. Reset logic 319 may contain a digital buffer and level shifter to sharpen the transition edges and to do the required voltage level shifting from a low-voltage digital level to relatively high voltage analog level, as well as necessary logic element to generate complementary reset signal that may be used in the reset switches in integrator 314.

Integrator 314 can perform multiple integration operations during a single exposure time, and its final value is read from the pixel using an analog driver 324, whose output 325 is connected to a common analog bus 326 when that particular pixel is selected during readout. This analog value contains only information from the last exposure and the information about previous exposures are contained in a number of triggering pulses generated at comparator output 318.

The comparator output signal 318 generated in layer-1 is capacitively coupled to layer-2 for further processing using coupling capacitor 328. Comparator 317 drives the top plate 327 of the coupling capacitor 328, shielded by grounded metal plates 329 and 333 against any possible cross-talk between neighboring pixels.

The bottom plate 332 of the coupling capacitor 328 is connected to a receiver 335 in the second layer, which detects and amplifies the capacitively coupled pulses generated for each reset signal or operation 334, and generates proper digital pulses 336 to be used by the counting memory block 337 to be used as clock or trigger signals for counting operations. Outputs 338 of the memory block 337 are then read out using a common digital bus 342 driven by pixel digital drivers 339 when selected. To minimize the interconnect requirement, reading operation should be done serially.

Plates 327 and 332 of the coupling capacitor 328 can be formed using one of the metal layers used in CMOS process, and preferably very top metal layer to simplify the overall pixel routing and to increase the pixel coupling capacitance value to suppress parasitic effects. Capacitance value depends on the area of and distance between the plates. Capacitance area is limited by the pixel size and distance is limited by the passivation oxides 330 and 331 on the integrated circuits, and any physical gap possibly filled with an epoxy-like material during the chip-to-chip attachment process. For simplicity, neither the physical gap nor any filling material is shown in FIG. 3.

By using two layers 310 and 340, effective pixel area is doubled. Moreover, the first layer 310 can be fabricated using a dedicated CMOS image sensor (CIS) process with enhanced analog and electro-optical parameters, whereas the second layer 340 can be fabricated using a purely digital CMOS technology using ultra-fine design rules with increased transistor densities, effectively increasing the gain in pixel area by more than a factor of two, which would be the case if the same technology node were used for both layers.

Using a two layer approach, the dynamic range of the pixel is extended allowing multiple integration cycles over a single exposure time and counting the number of reset operations used to avoid saturation at pixel level. Layer-1 310 provides analog representation of the very last integration value, whereas layer-2 340 provides count value of the performed reset operations. Then, the amount of collected charges is proportional to the sum of variation of the integrator output 316 since the last reset operation and product of the allowed swing of the integrator and count of the reset operations for a given exposure time.

The two layer approach allows integration of many circuit blocks at the pixel level; however, there is still a need for multiplexing circuitry to read out all the pixel values to external electronics outside the chips. This requirement is not very different of what has been developed and in use for monolithic CMOS image sensors. In typical CMOS image sensors, outside the pixel array there are row and column select circuits, analog amplifier and analog memory circuits implemented in a column parallel architecture followed by shared analog video drivers or shared on-chip analog-to-digital converters. Another approach is to use column-parallel analog-to-digital converter architecture, to be able to digitize analog signals as early as possible along the signal chain, to optimize power, and to reduce any possible undesired noise coupling. Layer-2 340 also requires multiplexing to read digital bits from an, array of pixels. Some differences include the multiplexer design is purely digital and relatively higher frequency multiplexing is required due to serial readout of digital bits from the pixel array. Bits that are readout from each pixel can be stored in digital column memory before going through another level of multiplexing to be transmitted to external electronics. To support required scanning data rates with reasonable number of pads, digital pixel data can be transmitted serially out of both layers.

FIG. 3 also shows the integration of two physical layers where pixel level signaling is achieved using capacitive coupling method. First layer 310 shows the circuitry to detect photons and to perform multiple charge integration operations to extend the dynamic range numerically. To be able to extend the dynamic range numerically, a number of integration cycles should be recorded in addition to the final integration value generated by the first layer 310. The information about the number of integration values is passed via coupling capacitor at the pixel level, which is different than previous pixel level interconnection methods where indium bumps are used for conventional hybrid methods or additional silicon through vias are used in more advanced 3-D integrated circuits. The proposed method provides a simple alternative targeting increased yield and reduced fabrication costs.

FIG. 3 is a circuit block diagram 300 according to one embodiment of the disclosure. In FIG. 3, pixel 300 is shown as having a pixel surface underneath which ROIC-1 310 and ROIC-2 340 are formed. ROIC-1 310 and ROIC-2 340 are directly coupled through pixel level capacitors whose plates 327 and 332 are formed on corresponding ROIC surfaces closer to the integrated devices. In one embodiment, top capacitor plate 327 and passivation oxide plate 330 of coupling capacitor 328 are integrated with integrated circuit 310 and bottom capacitor plate 332 and passivation oxide plate 331 of coupling capacitor 328 are integrated with integrated circuit 340. In the represented embodiment, the front side of integrated circuit 310 is positioned proximal to the front side of integrated circuit 340, where the term front side is used to designate the surface closer to the integrated devices in a given layer.

Figure 4:
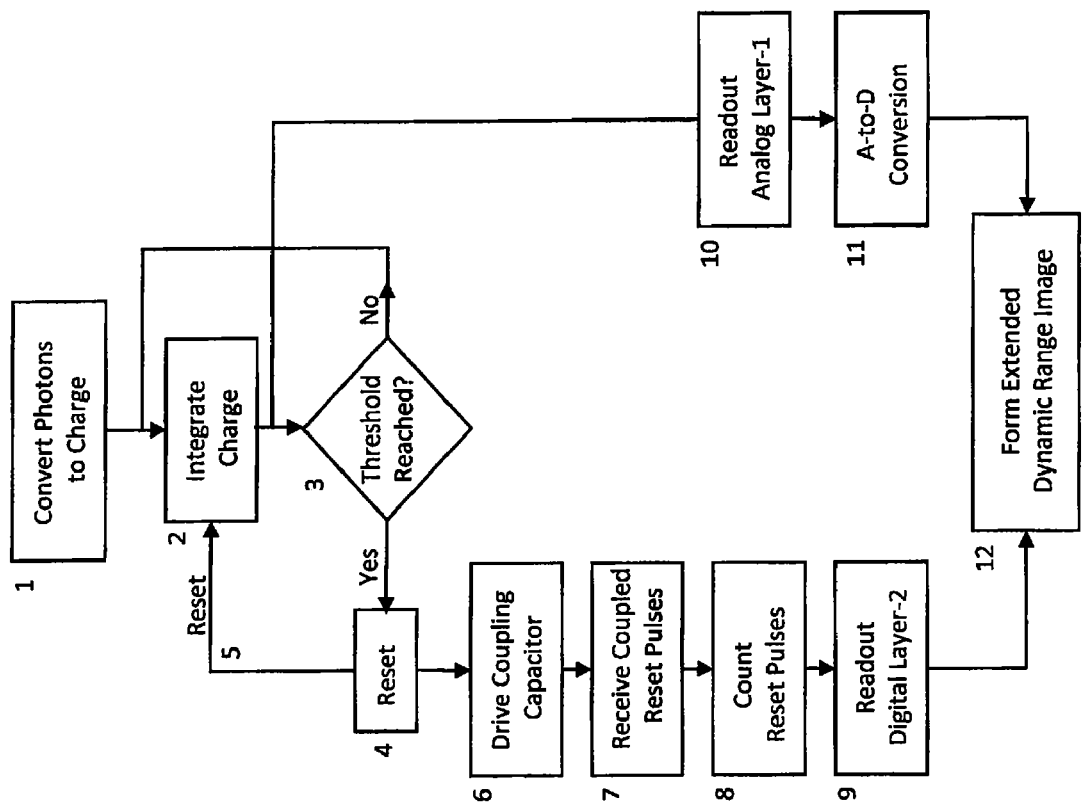
FIG. 4 shows a flow chart representing a method to increase the dynamic range of a back-side illuminated image sensor using a pixel level capacitive coupling technique according to an embodiment of the present invention.

FIG. 4 shows a flow chart representing a method to increase the dynamic range of a back-side illuminated image sensor using a pixel level capacitive coupling technique. First, photons are detected and converted to charge (1). The generated charge is integrated until it is reset (2). The reset signal of the integrator is driven by a comparator which checks whether integrator output has reached a pre-defined threshold level or not (3). When this threshold is reached, integrator reset signal is activated and integrator is reset (4 and 5). Otherwise, integration is continued. After each reset operation, coupling capacitor is driven by this reset signal (6). This reset signal is then detected in the second layer coupled to the first layer through the pixel level coupling capacitor (7). A counter counts and stores the received reset pulses as digital bits (8). A readout circuit in the second layer then reads out the stored digital bits from each pixel (9). In parallel, analog value from the last integration cycle is read out by a readout circuit in the first layer (10). There can also be on-chip analog-to-digital (A-to-D) converters to digitize the analog integrator outputs (11). The A-to-D conversion can also be done external to the first layer. Finally, digital values from both layers are combined to form an image with extended dynamic range (12).

Referring to FIGS. 3 and 4, a back-side illuminated image sensor having two readout integrated circuits (ROICs) capacitively coupled at the pixel level. Both ROICs have a pixel array and analog and digital scanning circuits to read out corresponding pixel values. The pixel values from both ROICs are combined to form an image with extended dynamic range.

The pixel array of the first ROIC includes a matrix of pixel elements where each pixel contains a photo sensitive element, such as a photodiode, to detect incident photons and convert them to charge signal. The converted charge is integrated either by the photodiode or by a dedicated integrator circuit, such as a capacitive trans-impedance amplifier (CTIA), which is operated multiple times during a single operation. The integrator is reset before each integration operation controlled by a comparator circuit which generates a pulse to activate integrator reset operation when the integrator output reaches a pre-determined voltage level. Hence, a multi-cycle integration is performed over a single exposure period. The comparator also transmits the reset signal to the second readout integrated circuit by deriving the top plate of a capacitor used for pixel level capacitive coupling. The top plate of the coupling capacitor is also implemented within pixel circuitry in the first readout integrated circuit. Since it is a driven node, it has a well defined voltage.

Analog and digital scanning circuits outside the pixel array of the first ROIC is used to read the analog pixel value from the last integration cycle sequentially by reading out one row of pixels after another, similar to conventional CMOS image sensors. The main difference from conventional CMOS image sensors is that first ROIC also performs pixel level signal processing, which includes photon detection and charge generation, charge integration, and driving the second ROIC capacitively. Control signals used in conventional 3-T CMOS pixels are pixel reset and pixel select, where pixel reset can be used to reset the integrator at the beginning of the exposure, and pixel select can be used to route the last integration value to the column readout circuits outside the pixel array.

Exposure or integration time can be controlled by a separate signal that enables the integrator circuit when active and triggers sample and hold circuit when not active, which allows reading out analog pixel values while integration takes place. Due to complicated pixel electronics some bias voltage are required to bias the analog blocks as well as to define required voltage levels such as comparator threshold and integrator reset levels. There should be one common routing line for each of these voltage bias signals routed either horizontally shared by all pixels in a row or routed vertically shared by all pixels in a given column. Required voltage biases for pixels can be generated on-chip outside the pixel array to save both area and power. There is a common analog bus used to route analog pixel values to an analog or mixed-signal readout circuit integrated outside the pixel array. Pixels in a given column share a single analog bus, where bus access is controlled by select signals routed horizontally. Pixel array is read out line by line by the column readout circuit usually implemented to have a dedicated readout channel for each column to shorten pixel read time.

Column readout circuit contains amplifiers to boost the signal level, offset adjustment circuits to adjust a DC level of the signal, sample and hold amplifiers to hold the conditioned signal while the next one is being processed, and line drivers and multiplexer circuits to route the processed signal to analog outputs, where on-chip analog video buffers drive external analog-to-digital converters if the first ROIC does not have an on-chip ADC. It is also possible to digitize the analog pixel values on the chip. Basically, two approaches can be utilized. The first approach integrates ADCs right before the pads, using the same analog signal processing chain as in the case of analog output ROICs. The second approach integrates ADC in every column, targeting digitization as early as possible in the signal chain to improve signal immunity and save power. In both cases, output of the first ROIC contains representation of the pixel values for a given exposure time from the very last integration cycle. Therefore, it is only a partial representation of the pixel value, and to be able to extract the full analog representation of the pixel value, it is needed to know how many times the pixel got reset during a given exposure time. This complementary information is extracted by the second ROIC, whose operation principle is explained next.

The pixel array of the second ROIC includes a matrix of pixel elements where each pixel has a receiver to detect the reset pulse transmitted through the coupling capacitor between each pixel from the first and second ROICs and generates a digital pulse. The receiver can be implemented using a comparator that has a sufficiently high gain required to restore a relatively small coupled signal to a proper CMOS logic level. To shorten the decision time a latching circuit with positive feedback can be added to the comparator. The counting memory block counts the digital pulses generated by the receiver and stores the count of received reset pulses. Counting memory can be implemented using flip-flops and combinational logic elements arranged in synchronous or ripple counter architectures. To minimize the number of logic cells and hence to decrease the implementation area of the counting memory, any counting order can be used as long as every count state is used only once and it is repeatable for all cycles. The counter may have a reset input so that all the counter bits are reset and start from a known value at the beginning of each exposure. However, it is not necessary if the counting sequence is such that it returns to a known state after reaching a known value. Therefore, it is possible to calculate the difference between the counter values from two consecutive exposures provided that the previous value is known. The counter may have N bits, where the number N is related with maximum intensity that the imager can display without saturation. In other words, the full well capacity of the pixel is extended numerically by a factor equal to how many states the counter has. For a binary counter, this can be as high as Nth power of 2 provided that all the possible states are used in the counting sequence.

At the end of the exposure time, the counting operation should be stopped. This can be controlled by the first or second ROIC pixels by disabling the generation of the comparator output 318 or the effect of it. To achieve this, a global count enable signal can be used or it can be generated from the global reset signal. In both cases, a logic circuit can be added after the comparator output 318 to mask the generated pulse when the counter is not enabled or when the global pixel reset is active.

Digital scanning circuits outside the pixel array of the second ROIC are used to read the digital counter bits from the pixel array sequentially by reading out one row of pixels after another. For each column of pixels there is at least a single bus used to transmit pixel bits sequentially from a selected pixel in a selected row to the digital multiplexing circuit implemented outside the pixel array on top of the pixel columns. To shorten the readout time, a readout circuit can be placed on top and underneath of every pixel column. By using multiple signal buses, multiple bits can be readout at the same time from a selected pixel. Due to a limited pixel area, it is usually necessary to share a single bus and multiplex pixel bits over a single column bus. Serially received pixel N-bits are converted back to parallel format using a shift register integrated in the column circuit. Before a new row of pixels is read out, content of the N-bit column register is transferred to a second register in the column so that this value can be multiplexed while a new value is being read out. This second transfer operation can be done serially or in parallel form. Memory elements of this N-bit register can be implemented using flip-flops or any other digital memory circuit with read and write capability. Outputs of second N-bit column registers are connected using tri-state bus drivers to an N-bit parallel bus that span a group of pixel columns, which is repeated multiple times on top of the pixel array to limit the capacitive load of the N-bit parallel bus. A tri-state bus driver is basically a digital buffer or driver that can disconnect itself from the bus with a high output impedance when not activated, allowing an active buffer to drive the bus with low impedance.

Multiplexing speed of a single bus line is M times higher than the refresh rate of the N-bit column registers, where M is the number of columns that share this parallel bus. The multiplexed parallel bits can go through one more multiplexing and also data encoding at the output to reduce the number of output pads and reduce possible data transmission errors. The multiplexing at the pad level can be done by using high-speed parallel to serial converters and high speed pad drivers. Encoding can be implemented at low speeds before parallel-to-serial conversion using CMOS logic elements. Pad drivers can use low voltage differential signaling (LVDS) or current mode logic (CML) standards, providing both speed and power advantages over CMOS or TTL level signaling standards.

The second ROIC outputs contain the information on how many times the integrator in the first ROIC is reset. This information alone is not sufficient to represent the pixel value fully, since it has a very coarse quantization step equal to the swing of the pixel integrators in the first ROIC. Therefore, they correspond to the most significant bits (MSB) of a wide dynamic range ADC, whose least significant bits (LSB) should come from the digitized outputs of the first ROIC.

The outputs from the first ROIC and the second ROIC can be combined together to form a digital representation of wide dynamic range ADC outputs, where LSB bits come from first ROIC either using on-chip ADCs or external ones and MSB bits come from the second ROIC. To achieve a good linearity, offset, and gain corrections should be performed to achieve a seamless integration at the point where the two input-output curves of the MSB and LSB portions meet. Offset and gain correction requires characterizing the analog circuits in great detail, where the gain, swing, and offset of the analog column circuitry as well as integrators and comparators in the pixel array need to be measured.

While the specification has been disclosed in relation to the exemplary embodiments provided herein, it is noted that the inventive principles are not limited to these embodiments and include other permutations and deviations without departing from the spirit of the disclosure.

What is claimed is:

1. An active pixel image sensor (APS) configured to sense a photon received by a pixel surface, the APS comprising:
   a first integrated circuit (IC) layer having a first back surface coupled to the pixel surface for receiving the photon, a first front surface having a first plate, and an analog device formed between the first back and front surfaces, the analog device coupled to the pixel surface and the first plate;
   a second IC layer formed underneath the first IC layer, the second IC layer having second front and back surfaces and a digital device formed between the second front and back surfaces, the second front surface having a second plate configured to be capacitively coupled to the first plate of the first IC layer, the digital device coupled to the second plate of the second front surface; and
   a passivation oxide layer coupled between the first and second plates, wherein the first and second plates and the passivation oxide layer form a capacitor between the first and second IC layers.

2. The APS of claim 1, further comprising a substrate, wherein the second IC layer is a first CMOS, layer formed on the substrate, the passivation oxide layer is formed on the second IC layer, and the first IC layer is a second CMOS layer formed on the passivation oxide layer.

3. The APS of claim 1, wherein the analog device of the first IC layer is configured to provide a fine analog representation of the received photon, and wherein the digital device of the second IC layer is configured to provide a coarse digital representation of the received photon.

4. The APS of claim 1, wherein the photon includes one or more photons, and wherein the analog device includes a photon detector configured to receive the one or more photons from the pixel surface and to convert the one or more photons to one or more charges.

5. The APS of claim 1, wherein:
   the photon includes one or more photons,
   the analog device is configured to convert the one or more photons to one more charges for a predefined exposure time, and
   the analog device includes an integrator configured to generate a cumulative signal based on the one or more charges.

6. The APS of claim 1, wherein:
   the photon includes one or more photons,
   the analog device is configured to generate a cumulative signal based on the one or more photons and for a predefined exposure time, and
   the analog device includes a comparator configured to generate a comparator output signal when the cumulative signal reaches a predefined threshold.

7. The APS of claim 6, wherein the analog device includes a reset logic configured to reset the cumulative signal based on the comparator output signal.

8. The APS of claim 1, wherein:
   the photon includes one or more photons,
   the analog device is configured to generate a comparator output signal when the one or more photons reach a predefined threshold, and the digital device includes a receiver capacitively coupled to the analog device, the
   receiver is configured to receive the comparator output signal and generate one or more digital pulses based on the comparator output signal.

9. The APS of claim 8, wherein the digital device includes a counting memory coupled to the receiver, the counting memory is configured to count the one or more digital pulses.

* * * * *